United States Patent
Wertz et al.

(10) Patent No.: US 10,217,919 B2
(45) Date of Patent: Feb. 26, 2019

(54) LED MODULE

(71) Applicant: Air Motion Systems, Inc., River Falls, WI (US)

(72) Inventors: Jared J. Wertz, River Falls, WI (US); Noel E. Neuman, Woodbury, MN (US)

(73) Assignee: Air Motion Systems, Inc., River Falls, WI (US)

( * ) Notice: Subject to any disclaimer, the term of this patent is extended or adjusted under 35 U.S.C. 154(b) by 0 days.

(21) Appl. No.: 15/205,938

(22) Filed: Jul. 8, 2016

(65) Prior Publication Data

US 2017/0009961 A1    Jan. 12, 2017

Related U.S. Application Data

(60) Provisional application No. 62/189,785, filed on Jul. 8, 2015.

(51) Int. Cl.
| | |
|---|---|
| *H01L 33/60* | (2010.01) |
| *H01L 33/64* | (2010.01) |
| *B41J 11/00* | (2006.01) |
| *H01L 25/075* | (2006.01) |

(52) U.S. Cl.
CPC .......... *H01L 33/648* (2013.01); *H01L 33/60* (2013.01); *B41J 11/002* (2013.01); *H01L 25/0753* (2013.01)

(58) Field of Classification Search
USPC .................................................. 250/504 R
See application file for complete search history.

(56) References Cited

U.S. PATENT DOCUMENTS

| | | | |
|---|---|---|---|
| 5,973,331 A | 10/1999 | Stevens et al. | |
| 7,791,089 B2 * | 9/2010 | Bisberg | H01L 33/58 257/100 |
| 8,378,322 B2 * | 2/2013 | Dahm | F21V 29/30 250/496.1 |
| 9,018,600 B2 * | 4/2015 | Stowell | B41J 11/002 250/492.1 |
| 9,105,367 B2 * | 8/2015 | Childers | C03C 25/12 |
| 2009/0045714 A1 | 2/2009 | Claeys | |
| 2011/0049392 A1 | 3/2011 | Martinez et al. | |
| 2013/0087722 A1 | 4/2013 | Brown | |
| 2013/0187063 A1 | 7/2013 | Dahm et al. | |

OTHER PUBLICATIONS

The International Search Report and Written Opinion rendered by the International Searching Authority for PCT/US16/41597, dated Oct. 26, 2016, 19 pages.

* cited by examiner

*Primary Examiner* — Phillip A Johnston
(74) *Attorney, Agent, or Firm* — Skaar Ulbrich Macari, P.A.

(57) ABSTRACT

An LED module includes a base portion, a first reflector portion secured to a first side of the base portion, a second reflector portion secured to a first side of the base portion; and an LED package disposed along the first side of the base portion. The LED package can be secured on a first end between the base portion and the first reflector portion, and on a second end between the base portion and a second reflector portion. Coolant channels can be defined through the base and reflector portions. A connector can electrically connect negative and positive terminals of adjacently located and oppositely oriented LED elements in the LED package. The reflector portions can be exchanged for other reflector portions that have a different reflector profile.

20 Claims, 5 Drawing Sheets

LED MODULE

PRIORITY

This application claims priority under 35 U.S.C. § 119(e) to, and hereby incorporates by reference in its entirety, U.S. Provisional Application No. 62/189,785, filed Jul. 8, 2015.

FIELD

This invention relates to an apparatus for curing deposited substances on a substrate and, in particular, this invention relates to LED modules for curing substances deposited on a substrate by irradiation.

BACKGROUND

In the printing industry, use of ultra-violet (UV) curable inks and other substances is increasing, due to the increasingly fast curing rates effected by UV radiation. The UV radiation is increasingly being produced by high intensity light emitting diodes (LEDs).

High intensity LED devices generate a considerable amount of energy in two different ways. The first type of energy is in the form of heat. The second form of energy is in the form of light. The light contains energy that is absorbed by the optical focusing reflector, the absorbed energy is converted into heat. Thus, high intensity LED devices such as those used to produce UV radiation present great challenges in designing thermal energy management, optical energy management, and electrical energy management (interconnection). This is a particular problem in designing LED light-emitting systems that must focus high levels of specific wavelength light at relatively short distances, such as 10 mm-100 mm. These designs require high density packaging (mounting) of the LED devices. There is a continuing need to provide improved LED modules for high intensity UV curing systems.

SUMMARY

The disclosure includes a light emitting diode (LED) module. The LED module includes a base portion including a first side that extends between a first end and a longitudinally opposing second end, a first reflector portion secured to a first side of the base portion and extending between the first and second ends of the base portion; a second reflector portion secured to a first side of the base portion and extending between the first and second ends of the base portion, and an LED package disposed along the first side of the base portion. A first gap is defined between the first reflector portion and the first side of the base portion. A second gap is defined between the second reflector portion and the first side of the base portion. The LED package is partially disposed in each of the first and second gaps.

A first depression can be defined in the first side of the base portion and extend between the first and second ends of the base portion. A rib can be defined along a side of the first reflector portion that contacts the first side of the base. The rib of the first reflector portion can be contoured to engage the first depression.

A second depression can be defined in the first side of the base portion and extend between the first and second ends of the base portion. A rib is defined along a side of the second reflector portion that contacts the first side of the base. The rib of the second reflector portion can be contoured to engage the first depression.

A plurality of fasteners can be provided to secure each of the first and second reflector portions to the base portion.

A notch can be defined in the first reflector portion adjacent to the first side of the base portion to define the first gap.

The first and second reflector portions can each define a side surface including a parabolic curved portion.

The base portion can define a first fluid channel and can extend from the first end to the second end of the base portion. The first reflector portion can define a second fluid channel and can extend from the first end to the second end of the base portion. The second reflector portion can define a third fluid channel and can extend from the first end to the second end of the base portion.

The LED package can define a plurality of LED elements disposed adjacent to one another. The LED elements can be oriented such that a positive terminal of a first LED element lies adjacent to a negative terminal of a second LED element. An electrical connector can span between the positive terminal of the first LED element and the negative terminal of the second LED element to form an electrical connection between the first and second LED elements.

The electrical connector can be configured to define a first contact region adjacent to the positive terminal and a second contact region adjacent to the negative terminal.

A plurality of electrical connectors can be disposed along a line to connect the plurality of LED elements. A rail can then be secured to each of the plurality of LED elements lying along the line.

The positive terminal of the first LED element and the negative terminal of the second LED element can be disposed in the first gap, and a positive terminal of the second LED element and a negative terminal of the first LED element can be disposed in the second gap.

The LED elements can be connected in a series arrangement.

The disclosure further includes a method of providing an LED module. The method includes disposing an LED package along a base portion, capturing a first end of the LED package between the base portion and a first reflector portion by securing the first reflector portion to the base portion, and capturing a second end of the LED package, which is located opposite the first end, between the base portion and a second reflector portion by securing the second reflector portion to the base portion.

A fluid can be caused to flow through a first channel defined through an entire longitudinal length of the base portion, through a second channel defined through an entire longitudinal length of the first reflector portion, and through a third channel defined through an entire longitudinal length of the second reflector portion.

The fluid can flow first through the first channel before being directed to the second and third channels.

The fluid can flow in a first direction through the first channel and in a second direction opposite the first direction through the second and third channels.

The first and second reflector portions can define a first reflector profile. The first and second reflector portions can be replaced, using the same base portion, with a third and a fourth reflector portions defining a second reflector profile that is different than the first reflector profile.

The LED package can include a plurality of LED elements disposed adjacent to one another and oriented such that a positive terminal of a first LED element lies adjacent to a negative terminal of a second LED element. An electrical connector can be disposed such that it spans between the positive terminal of the first LED element and the negative terminal of the second LED element to form an electrical connection between the first and second LED elements.

The disclosure also includes an LED module that includes a base portion including a first side, a first reflector portion secured to a first side of the base portion, a second reflector portion secured to a first side of the base portion, and an LED package disposed along the first side of the base portion. The LED package can include a first LED element including a positive terminal and a negative terminal and a second LED element including a positive terminal and a negative terminal. The second LED element can lie adjacent to and in the same plane as the first LED element and be oriented such that the positive terminal of a first LED element lies adjacent to the negative terminal of a second LED element. An electrical connector can be disposed between the positive terminal of the first LED element and the negative terminal of the second LED element to form an electrical connection between the first and second LED elements.

A first end of the LED package can be secured between the first side of the base portion and the first reflector portion, and a second end of the LED package can be secured between the fist side of the base portion and a second reflector portion.

The above summary is not intended to limit the scope of the invention, or describe each embodiment, aspect, implementation, feature or advantage of the invention. The detailed technology and preferred embodiments for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

Figure 1:
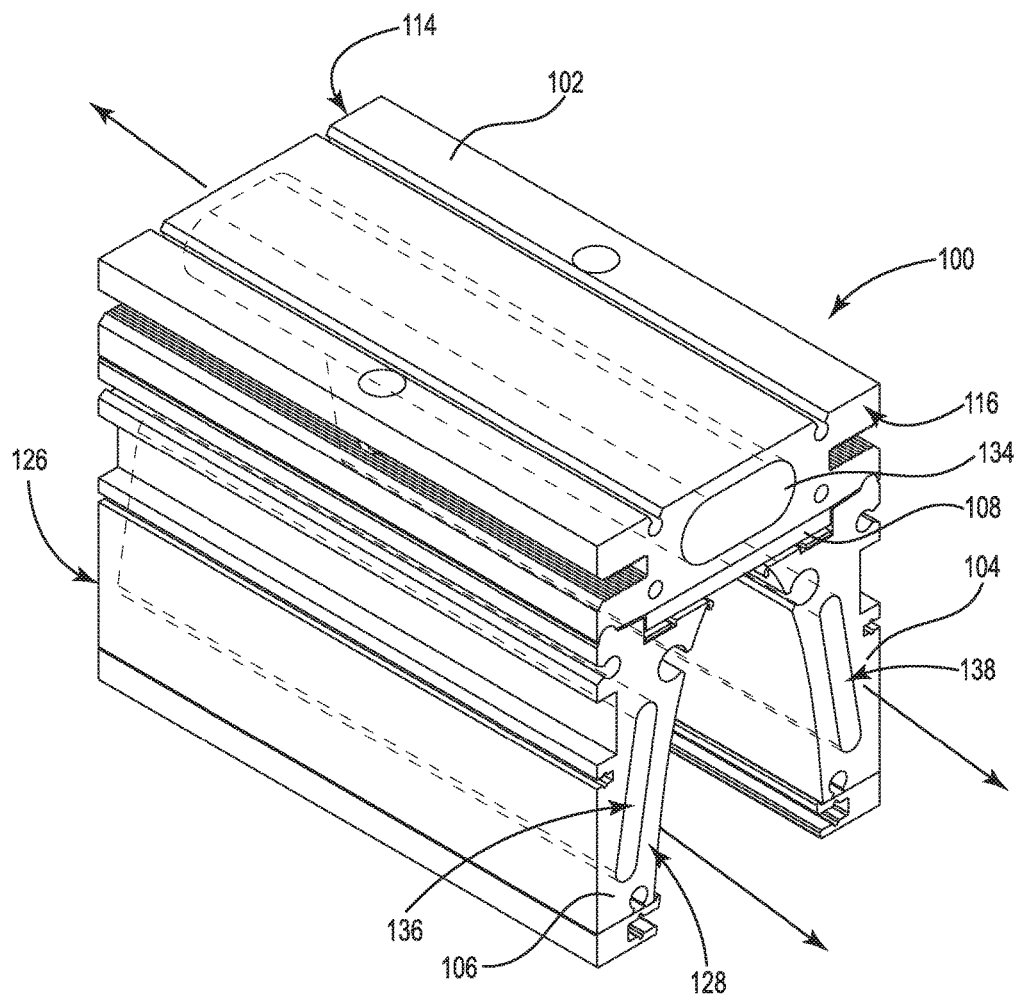
FIG. 1 is a perspective view of an LED module according to certain example embodiments.

It is understood that the above-described figures are only illustrative of the present invention and are not contemplated to limit the scope thereof.

DETAILED DESCRIPTION

In the following descriptions, the present invention will be explained with reference to various exemplary embodiments. Nevertheless, these embodiments are not intended to limit the present invention to any specific example, environment, application, or particular implementation described herein. Therefore, descriptions of these example embodiments are only provided for purpose of illustration rather than to limit the present invention.

While the invention is amenable to various modifications and alternative forms, specifics thereof have been shown by way of example in the drawings and will be described in detail. It should be understood, however, that the intention is not to limit the invention to the particular example embodiments described. On the contrary, the invention is to cover all modifications, equivalents, and alternatives falling within the scope of the invention as defined by the appended claims.

Individual LED elements are arranged in an assembly which is called a package. The complete assembly is referred to as a LED package. The LED package is disposed in a housing that manages (contains) the electrical connections and the cooling capabilities. The complete housing with LED package is referred to as an LED module. The light emitted by the LED module can be used for processing chemicals and solutions. For example the light can be used for polymerizing UV-sensitive ink during printing. The processing of different chemicals and solutions requires different focusing fixtures.

An LED module is depicted in FIG. 1 generally at 100. The LED module 100 generally comprises a base portion 102 and a pair of reflector portions 104 and 106. An LED package 108 is disposed along the base 102 and extends between the reflector portions 104, 106. The light or radiation emitted by the individual LED elements 109 (see FIGS. 6-7) is reflected, focused and/or collimated by the reflector portions 104 and 106.

Figure 2:
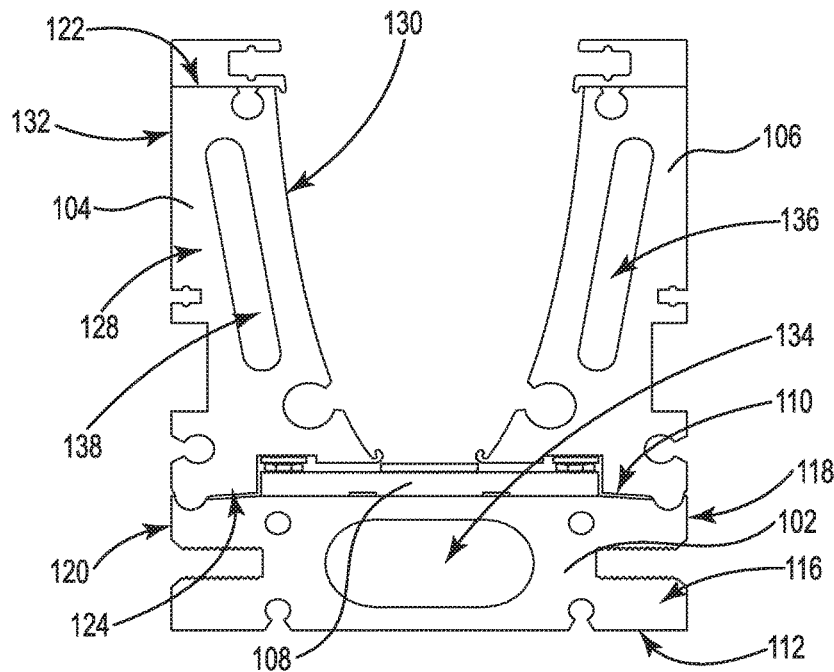
FIG. 2 is an end view of the apparatus of FIG. 1.
Figure 3:
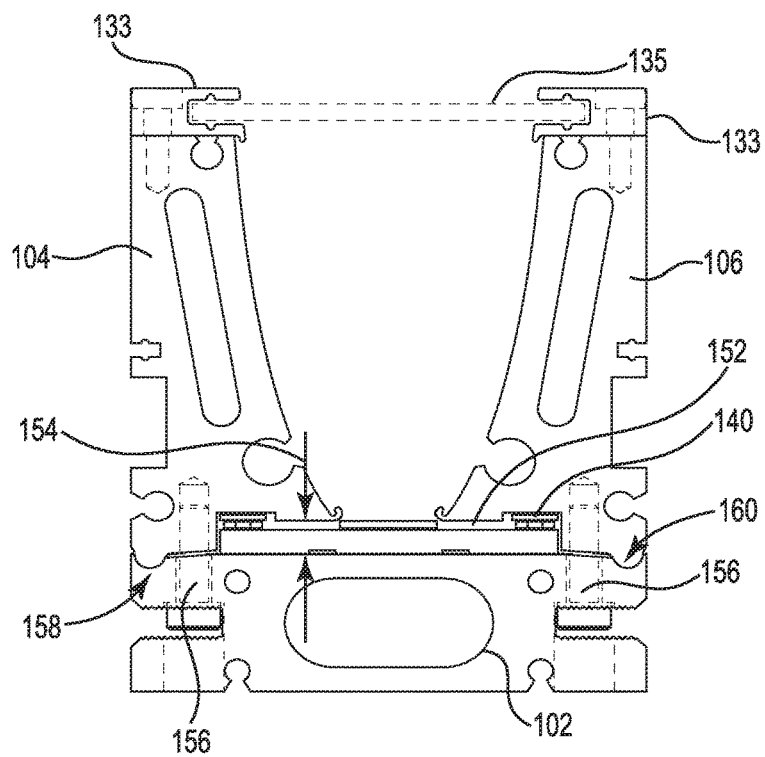
FIG. 3 is another end view of the apparatus of FIG. 1.
Figure 4:
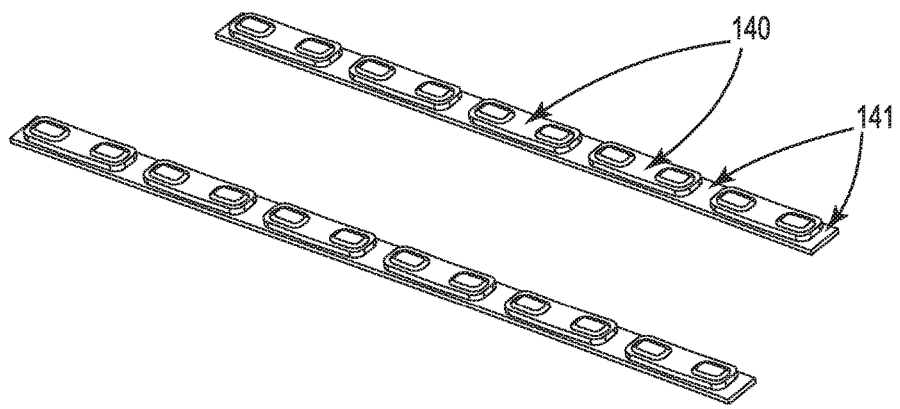
FIG. 4 is a perspective view of connected LED elements according to certain example embodiments.

Referring to FIGS. 1-3, the base 102 defines a longitudinal length and includes opposing major top 110 and bottom 112 surfaces spanning between first 114 and second 116 end surfaces. Opposing minor side surfaces 118 and 120 also span between the first and second end surfaces.

Again referring to FIGS. 1-3, each of the reflector portions 104, 106 defines opposing top 122 and bottom 124 surfaces spanning between first 126 and second 128 end surfaces. Side surfaces 130 and 132 span between the first and second end surfaces and between the top and bottom surfaces. The side surface 130 facing inwards of the module 100 can comprise an arcuate or curved surface that functions to reflect and direct light emitted by the LED package.

In certain embodiments, each of the base 102 and reflector portions 104, 106 can be formed as extrusions comprising a thermally conductive material such as aluminum.

Brackets 133 can be disposed atop the top surface 122 of each reflector portion 104, 106, as shown in FIGS. 2-3. These brackets are configured to receive and secure a window or transparent cover portion 135 that spans across the opposing reflector portions 104, 106.

Each of the base 102 and reflector portions 104, 106 includes a respective fluid channel or conduit 134, 136 and 138 formed longitudinally through the portion's entire longitudinal length. Each of the channels 134, 136, 138 are open at the respective opposing first and second longitudinal ends. The openings permit the module 100 to be joined with an adjacent module having similar configuration, or the openings can be covered with an end cap.

One example of an end cap is a so-called crossover end cap that directs the fluid flow exiting from one or more of the fluid conduits and introduces it to one or more different conduits in the module. A crossover end cap is disclosed in U.S. Pat. No. 8,641,236, the entirety of which is hereby incorporated herein by reference.

Another example of an end cap is a so-called connector end cap. This end cap has fittings for connecting external fluid supply and return lines to the respective conduits in the base and reflector portions. A connector end cap is also disclosed in U.S. Pat. No. 8,641,236.

The fluid conduits 134, 136 and 138 allow coolant to flow through the respective portions 102, 104, 106 of the module 100 to remove heat from the module portions. In one embodiment, chilled water is pumped through the conduits in order to absorb heat from the base 102 and reflector 104, 106 portions. Of course, other types of fluids can be used instead of chilled water without departing from the scope of the invention.

In one particular embodiment, the chilled water first is introduced into the conduit 134 of the base portion 102 as shown by the arrow in FIG. 1. The chilled water is subsequently circulated back though the conduits 136 and 138 in the respective reflector portions 104, 106 as indicated by the further arrows in FIG. 1. In such arrangement, the conduit 134 in the base 102 is a supply conduit and the conduits in the reflectors 136, 138 are return conduits. The circulation can be accomplished, for example, by a crossover end cap disposed on one end of the module, or on one end of a subsequent module wherein the conduits are in fluidic communication.

In the embodiment discussed above, the chilled water initially cools the LED elements 109 before traveling through the reflector portions 104, 106 to cool absorbed energy of the LED radiation. Thus, the coldest water first enters the water channel 134 beneath the LED package 108, where it absorbs the heat produced by the LED elements 109. After exiting the supply water channel 134, the water is re-routed to the conduits 136, 138 in the reflector portions 104, 106 to remove heat from the reflector portions.

Referring to FIGS. 1 and 4-7, the reflector package 108 is generally planar and includes a plurality of element connectors 140 extending vertically upwards from the LED element substrates 141 to which the individual LEDs are mounted.

Figure 7:
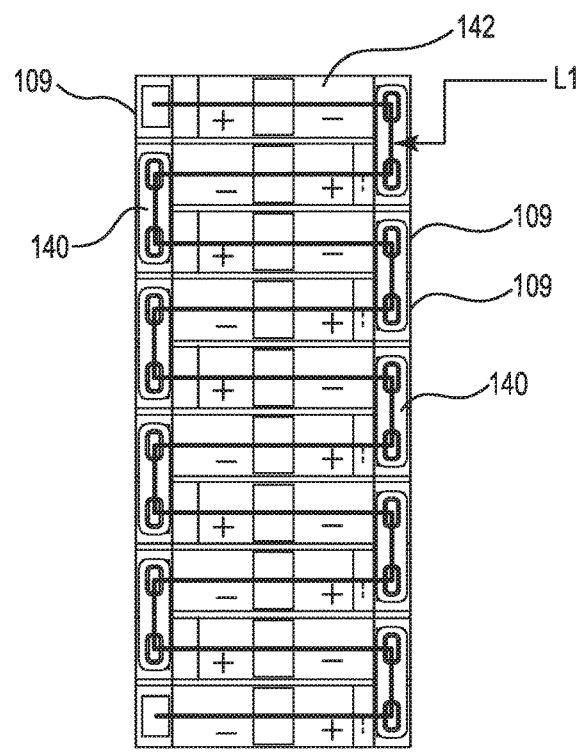
FIG. 7 is a top plan view of connected LED elements according to certain example embodiments.

The connectors 140 comprise a conductive material (e.g. metal) and have a longitudinal length such that they can extend between adjacent positive and negative contacts of adjacent LED elements as shown in FIG. 7.

Figure 5:
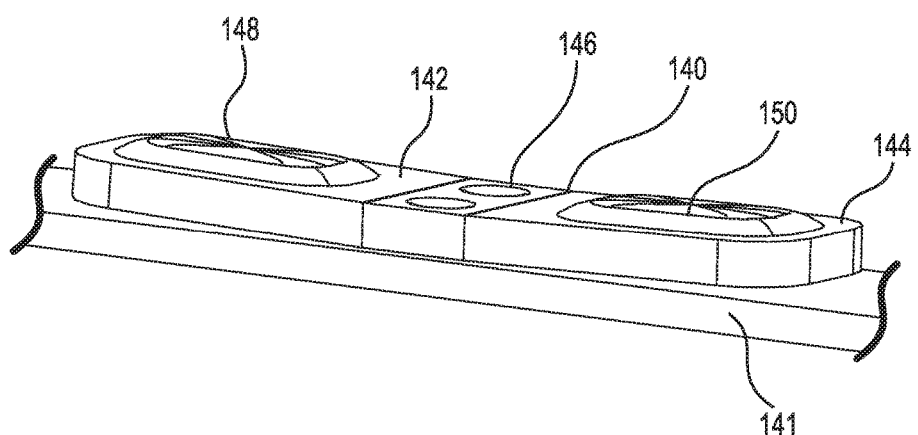
FIG. 5 is a perspective view of a connector shown in FIG. 4.

Referring to FIG. 5, each connector 140 defines a body comprising three segments. Two opposing body segments 142, 144 provide the electrical connections between adjacent LED elements. These two segments are divided by a fastening segment 146. The fastening segment includes fastener apertures for securing a rail thereto as will be discussed below. Each of the contact segments 142, 144 defines a respective contact region 148, 150 that extends vertically above the top surface of the connector 140. The contact regions 148, 150 correspond to the positive and negative contacts of the respective adjacent LED elements 109.

Figure 6:
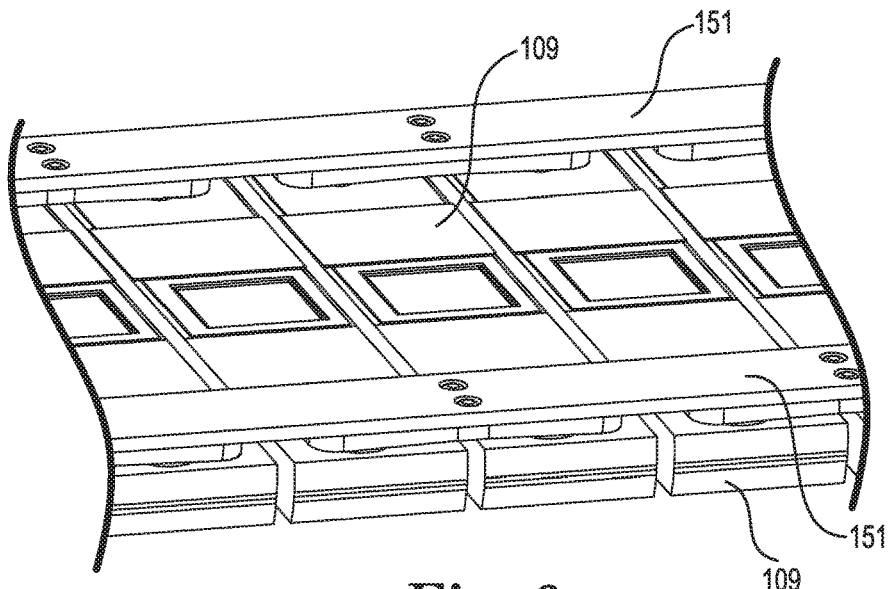
FIG. 6 is a perspective view of a portion of an LED package according to certain example embodiments.

Referring now to FIGS. 6-7, a plurality of individual LED elements 109 are arranged adjacent to one another (side-by-side). The LED elements are also oriented 180 degrees alternatingly so that a series connection can be formed by placing a given connector across a positive terminal of a first LED element and a negative terminal of a second LED element. Then a second connector is placed across the positive terminal of the second LED element and the negative terminal of a third LED element. This arrangement is repeated until all of the LED elements in a given package are connected in series as shown in FIG. 7.

As shown in FIG. 7, the individual LED elements 109 that form the package are arranged such that they are electrically connected in series by a plurality of connectors 140. This series wiring is shown by the line L1 in FIG. 7. Thus, only a single positive terminal and a single negative terminal of a given package need to receive an external electrical connection. The LED elements can also be arranged and electrically connected in parallel in certain embodiments.

A non-conductive rail 151 is fastened to each line of connectors on each end of the LED elements 109 to add structural support to the package. The rail can be formed of a non-electrical conducting material such as glass-reinforced epoxy material (FR-4).

Referring again to FIGS. 2-3, the reflector portions 104, 106 are disposed atop the upper surface of the base portion 102. A recessed region 152 in the lower surface of each of the reflector portions defines a gap 154 between the upper surface of the base portion 102 and the upper side of the recessed portion 152. The gap 154 provides clearance for the LED package to be disposed along the top surface of the base portion 102. The height of the gap 154 is defined such that the lower surface of each reflector portion 104, 106 in the recessed or notched region 152 compresses the respective connectors 140 on the LED package 108. Thus, the reflector portions 104, 106 both facilitate an electrical connection and provide a thermal connection with the LED package 108.

Fasteners 156 are inserted from the opposing bottom side of the base portion 102 as shown in FIG. 3 and tightened into a threaded portion defined in each of the reflector portions as shown in FIGS. 1 and 3. The fasteners 156 tightly secure all of the components in place.

A depression 158 can be formed in the upper surface of the base adjacent each side surface as shown in FIGS. 2-3. A corresponding rib 160 is defined along the lower surface of each of the reflector portions. The respective ribs 160 and depressions 158 conform to one another to provide further stability and security to the portions when secured via the fasteners 156. The ribs 160 and depressions 158 also function to align the respective reflector portions 104, 106 atop the base portion 102 so that the apertures for the fasteners are aligned, thus making insertion of the fasteners easier.

The rib/depression configuration acts as a hinge to facilitate compression of the LED contacts 140. A socket head cap screw can be used for the fastener. The reflector portion configuration, therefore, keeps the connectors under pressure to create a better contact for both electrical and thermal connections.

The rib 160/depression 158 pair can be different for each of the reflector portions 104, 106 in certain embodiments where the reflector portions should not be interchangeable with one another. Thus, the user would be easily made aware whether the first and second reflector portions 104, 106 are installed on their correct sides of the base portion 102.

Figure 8:
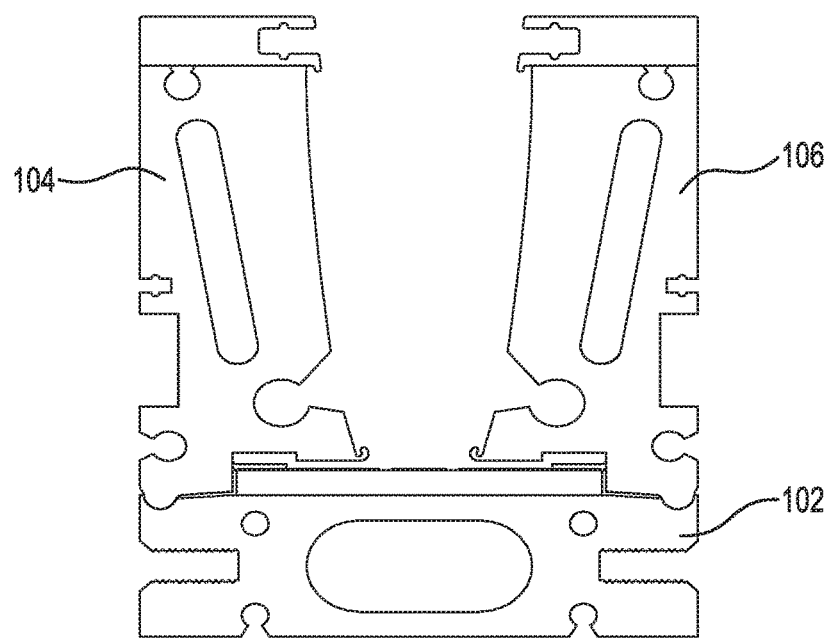
FIG. 8 is an end view of an LED module according to certain example embodiments.
Figure 9:
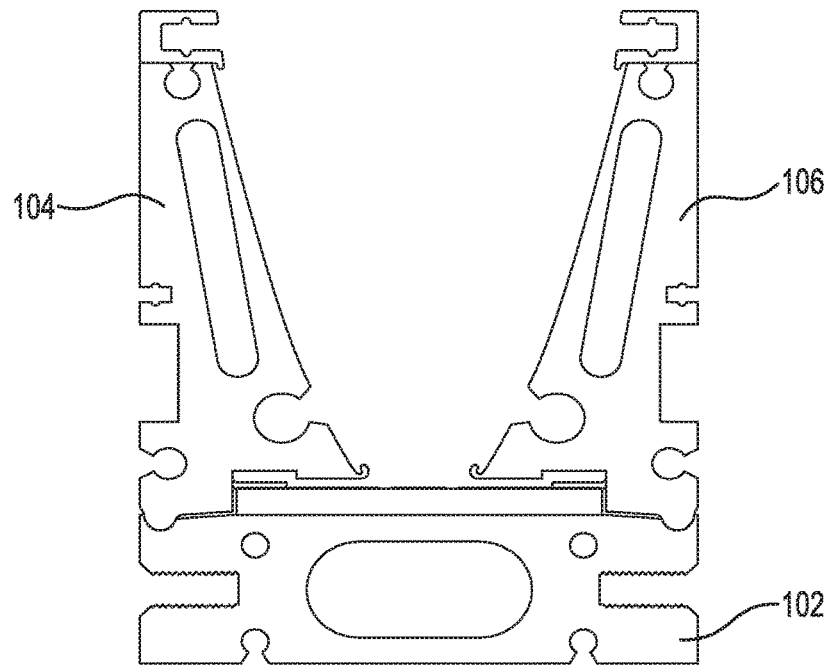
FIG. 9 is another end view of an LED module according to certain example embodiments.

The reflector portions 104, 106 for a given module 100 can be detached and easily exchanged for alternative reflector portions that have different focusing lengths or styles. For example, FIG. 8 shows elliptical reflector profile for focusing the light emitted by the LEDs. FIG. 9 shows a different example where the profile is a parabolic reflector for collimating the light emitted by the LEDs. Additional profiles can be provided for a wide variety of light focal lengths, shapes, and other characteristics. The base portion 102 can remain the same for all of the different reflector portion configurations, so manufacturing and inventory costs can be minimized.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products. Moreover, features or aspects of various example embodiments may be mixed and matched (even if such combination is not explicitly described herein) without departing from the scope of the invention.

What is claimed is:

1. A light emitting diode (LED) module, comprising:
   a base portion including a first side that extends between a first end and a longitudinally opposing second end;
   a first reflector portion secured to the first side of the base portion and extending between the first and second ends of the base portion;
   a second reflector portion secured to the first side of the base portion and extending between the first and second ends of the base portion; and
   an LED package disposed along the first side of the base portion,
   wherein a first gap is defined between the first reflector portion and the first side of the base portion,
   wherein a second gap is defined between the second reflector portion and the first side of the base portion,
   wherein the LED package is partially disposed in each of the first and second gaps, and
   wherein the first and second reflector portions facilitate an electrical connection and establish a thermal connection with the LED package.

2. The LED module of claim 1, wherein a first depression is defined in the first side of the base portion and extends between the first and second ends of the base portion, and wherein a rib is defined along a side of the first reflector portion that contacts the first side of the base, the rib of the first reflector portion being contoured to engage the first depression.

3. The LED module of claim 2, wherein a second depression is defined in the first side of the base portion and extends between the first and second ends of the base portion, and wherein a rib is defined along a side of the second reflector portion that contacts the first side of the base, the rib of the second reflector portion being contoured to engage the first depression.

4. The LED module of claim 1, further comprising a plurality of fasteners securing each of the first and second reflector portions to the base portion.

5. The LED module of claim 1, wherein a notch is defined in the first reflector portion adjacent to the first side of the base portion to define the first gap.

6. The LED module of claim 1, wherein the first and second reflector portions each define a side surface including a parabolic curved portion.

7. The LED module of claim 1, wherein:
   the base portion defines a first fluid channel and extending from the first end to the second end of the base portion,
   the first reflector portion defines a second fluid channel extending from the first end to the second end of the base portion, and
   the second reflector portion defines a third fluid channel extending from the first end to the second end of the base portion.

8. The LED module of claim 1, wherein the LED package defines a plurality of LED elements disposed adjacent to one another and oriented such that a positive terminal of a first LED element lies adjacent to a negative terminal of a second LED element, wherein an electrical connector spans between the positive terminal of the first LED element and the negative terminal of the second LED element to form an electrical connection between the first and second LED elements.

9. The LED module of claim 8, wherein the electrical connector defines a first contact region adjacent to the positive terminal and a second contact region adjacent to the negative terminal.

10. The LED module of claim 8, wherein a plurality of electrical connectors are disposed along a line to connect the plurality of LED elements and a rail is secured to each of the plurality of LED elements lying along the line.

11. The LED module of claim 8, wherein the positive terminal of the first LED element and the negative terminal of the second LED element are disposed in the first gap, and wherein a positive terminal of the second LED element and a negative terminal of the first LED element are disposed in the second gap.

12. The LED module of claim 1, wherein the LED package comprises a plurality of LED elements connected in a series arrangement.

13. A method of providing an LED module, the method comprising:
   disposing an LED package along a base portion;
   capturing a first end of the LED package between the base portion and a first reflector portion by securing the first reflector portion to the base portion;
   capturing a second end of the LED package, which is located opposite the first end, between the base portion and a second reflector portion by securing the second reflector portion to the base portion;
   pressing an electrical connector to the LED package with the first reflector portion when the LED package is captured between the base portion and the first reflector portion; and
   conducting heat from the LED package captured between the base portion and the first reflector portion into the first portion.

14. The method of claim 13, further comprising:
   flowing a fluid through a first channel defined through an entire longitudinal length of the base portion;
   flowing the fluid through a second channel defined through an entire longitudinal length of the first reflector portion; and
   flowing the fluid through a third channel defined through an entire longitudinal length of the second reflector portion.

15. The method of claim 14, wherein the fluid flows first through the first channel before being directed to the second and third channels.

16. The method of claim 14, wherein the fluid flows in a first direction through the first channel and in a second direction opposite the first direction through the second and third channels.

17. The method of claim 13, wherein the first and second reflector portions define a first reflector profile, the method further comprising removing the first and second reflector portions from the base portion and securing a third and a fourth reflector portion to the base portion, wherein the third and fourth reflector portions define a second reflector profile that is different than the first reflector profile.

18. The method of claim 13, wherein the LED package comprises a plurality of LED elements disposed adjacent to one another and oriented such that a positive terminal of a first LED element lies adjacent to a negative terminal of a second LED element, the method further comprising, prior to the capturing steps, disposing an electrical connector between the positive terminal of the first LED element and the negative terminal of the second LED element to form an electrical connection between the first and second LED elements.

19. An LED module, comprising:
    a base portion including a first side;
    a first reflector portion secured to the first side of the base portion;
    a second reflector portion secured to the first side of the base portion; and
    an LED package disposed along the first side of the base portion, comprising:
        a first LED element including a positive terminal and a negative terminal;
        a second LED element including a positive terminal and a negative terminal, wherein the second LED element lies adjacent to and in the same plane as the first LED element and is oriented such that the positive terminal of a first LED element lies adjacent to the negative terminal of a second LED element, and
        an electrical connector disposed between the positive terminal of the first LED element and the negative terminal of the second LED element to form an electrical connection between the first and second LED elements by compression of the electrical connector towards respective positive and negative terminals of the first and second LED elements when the first reflector portion is secured to the first side of the base portion,
    wherein the LED package is thermally coupled to both of the first and second reflector portions.

20. The LED module of claim 19, wherein a first end of the LED package is secured between the first side of the base portion and the first reflector portion, and wherein a second end of the LED package is secured between the fist side of the base portion and a second reflector portion.

* * * * *